(12) United States Patent
Svorc et al.

(10) Patent No.: US 9,473,029 B2
(45) Date of Patent: Oct. 18, 2016

(54) ADAPTIVE LOW-POWER ZERO-CROSS COMPARATOR FOR DISCONTINUOUS CURRENT MODE OPERATED SWITCHING MODE POWER SUPPLY

(71) Applicant: Dialog Semiconductor GmbH, Kirchheim/Teck-Nabern (DE)

(72) Inventors: Jindrich Svorc, Swindon (GB); Martin Faerber, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 49 days.

(21) Appl. No.: 13/895,575

(22) Filed: May 16, 2013

(65) Prior Publication Data

US 2014/0340065 A1 Nov. 20, 2014

(30) Foreign Application Priority Data

May 15, 2013 (EP) .................... 13368014

(51) Int. Cl.
*H02M 3/158* (2006.01)
*H02M 3/156* (2006.01)
*H02M 1/00* (2006.01)
*G01R 19/175* (2006.01)

(52) U.S. Cl.
CPC .......... *H02M 3/1588* (2013.01); *H02M 3/156* (2013.01); *G01R 19/175* (2013.01); *H02M 2001/0009* (2013.01); *H02M 2001/0038* (2013.01); *H02M 2001/0058* (2013.01)

(58) Field of Classification Search
None
See application file for complete search history.

(56) References Cited

U.S. PATENT DOCUMENTS

| | | | |
|---|---|---|---|
| 5,481,178 A * | 1/1996 | Wilcox et al. | 323/287 |
| 6,879,136 B1 | 4/2005 | Erisman et al. | |
| 7,447,049 B2 | 11/2008 | Garner et al. | |
| 7,554,310 B2 | 6/2009 | Chapuis et al. | |
| 7,768,245 B1 * | 8/2010 | De Cremoux | H02M 3/156 323/225 |
| 7,893,674 B2 | 2/2011 | Mok et al. | |
| 8,115,459 B2 | 2/2012 | Prodic et al. | |
| 8,143,874 B2 | 3/2012 | Templeton | |
| 8,274,266 B2 | 9/2012 | Engelhardt et al. | |
| 2002/0141209 A1 | 10/2002 | Bridge | |
| 2004/0027101 A1 | 2/2004 | Vinciarelli | |
| 2004/0090804 A1 | 5/2004 | Lipcsei et al. | |
| 2008/0012540 A1 | 1/2008 | Chen | |
| 2008/0094861 A1 | 4/2008 | Wang | |
| 2008/0122491 A1 * | 5/2008 | Kuan | 327/43 |
| 2009/0218998 A1 * | 9/2009 | Huang et al. | 323/282 |
| 2011/0241633 A1 * | 10/2011 | Herzer | H02M 3/157 323/271 |

OTHER PUBLICATIONS

European Search Report, 13368014.0-1809, Mailed: Dec. 6, 2013, Dialog Semiconductor GmbH.

* cited by examiner

*Primary Examiner* — Timothy J Dole
*Assistant Examiner* — Ishrat Jamali
(74) *Attorney, Agent, or Firm* — Saile Ackerman LLC; Stephen B. Ackerman

(57) ABSTRACT

A time off estimator and an adaptive controller implemented on an integrated circuit to emulate current dependent zero crossing circuitry to permit improved performance of a buck type switching mode power supply. The time off estimator circuit is enhanced by an automatic correction circuit for the timing of a zero crossing where energy to a reference capacitor returns to zero and is turned off awaiting the next cycle where the capacitor is again charged and discharged.

8 Claims, 6 Drawing Sheets

ADAPTIVE LOW-POWER ZERO-CROSS COMPARATOR FOR DISCONTINUOUS CURRENT MODE OPERATED SWITCHING MODE POWER SUPPLY

1. TECHNICAL FIELD

The present disclosure relates to power supplies and more particularly to low power zero cross comparator for discontinuous current mode operated switching mode power supply.

2. BACKGROUND

A zero crossing comparator is used in switching mode power supply (SMPS) to detect when current from an inductor in the power supply reaches zero and at that moment block, or turn off the inductor current. The precision, by which the zero crossing comparator operates, affects the efficiency of the power supply. If the current from the inductor is turned off late (after the zero crossing) the current in the inductor goes negative (overshoot) and a node voltage of the power supply goes above the input voltage turning on a parasitic diode and pushing the extra charge into Vin. If the current from the inductor is turned off early, current from the inductor is connected by a parasitic diode connected to ground, which increases losses since the voltage across the parasitic diode is higher than in the normal on state.

FIG. 1 is a simplified schematic of a typical buck type switching mode power supply (SMPS). The PMOS transistor P and the NMOS transistor N direct the current to and from the inductor L. The node voltage VLX is shown in FIG. 2, wherein the inductor current IL is turned off at the zero current crossing in condition A, late in condition B and early in condition C. Given the variations in the devices that make up the components in FIG. 1 and the very small signal input into the zero compare circuit ZC, the resulting variations in inductor current IL and the subsequent output voltage Vout across the load Rload will appear much like that in FIG. 2 for a typical production of the circuit. Improvement in the circuit design is needed if a more consistent circuit response is required.

US 2004/0027101 A1 (Vinciarelli) is directed to an apparatus comprising a buck-boost DC to DC switching power conversion, wherein a first switching device is interposed between a source and a first terminal of an inductor and a second switching device is interposed between the second terminal of the inductor and the load. U.S. Pat. No. 8,274,266 B2 (Englehardt et al.) is directed to a power supply system that comprises an inductor device and a plurality of switching devices that allow the power supply to operate in a boost mode. U.S. Pat. No. 8,143,874 B2 (Templeton) is directed to a switch mode power supply where an integrated circuit provides ease of integration with switch mode power supply (SMPS) designs. U.S. Pat. No. 8,115,459 B2 (Prodic et al.) is directed to a digitally controlled DC-DC converter with a power stage with at least one switch and an output capacitor. In U.S. Pat. No. 7,893,674 B2 (Mok et al.) a switch mode power supply (SMPS) is directed to a transient recovery circuit to stabilize the circuitry when a transition to a new output is performed. U.S. Pat. No. 7,554,310 B2 (Chapuis et al.) is directed to a switch mode voltage regulator comprising dual digital control loops. U.S. Pat. No. 7,447,049 B2 (Garner et al.) is directed to an SMPS controller using primary side sensing to detect a point of zero magnetic flux. U.S. Pat. No. 6,879,136 B1 (Erisman et al.) is directed to an inductor current emulation circuit for a switch mode power supply configured such that the inductor current goes to zero at least once during a cycle.

SUMMARY

It is an objective of the present disclosure to provide a time off ($t_f$) estimator to determine when switching current is turned off in a switching mode power supply (SMPS).

It is further an objective of the present disclosure to use an adaptive controller to determine the best toff time $t_f$.

In the present disclosure a switching mode power supply (SMPS) comprises a time off estimator and an adaptive controller. The time off estimator predicts a time when the flow of energy is turned off in a clock cycle and awaiting the next clock cycle, wherein the reactive element of the power supply is charged for time $t_r$ and then discharged for time $t_f$. The reactive element in the present disclosure is a capacitor in a voltage mode circuit used to mimic an inductor in a current mode circuit. An adaptive controller is used to sense over shoot or undershoot of the switching node above or below the supply rails and adjusts a voltage, vRefOffset, to determine the best turn off setting to avoid spikes caused by the turn off time being too long or truncation of the signal because the energy from the reactive device is terminated too soon.

For a buck type SMPS shown in FIG. 1, the toff time estimator is based on the basic inductor voltage/current relationship.

$$i_L(t) = \frac{1}{L}\int v_L(t)dt \qquad \text{EQ 1}$$

If it is assumed that the voltage across the coil is $V_L(t)$ is fixed, $V_L$, then EQ. 1 becomes simple multiplication.

$$i_L(t) = \frac{1}{L}V_L \cdot t \qquad \text{EQ. 2}$$

When EQ. 2 is applied to the coil current in FIG. 2 during $t_f$, the relation for $t_f$ is given by $$t_f = \frac{I_{peak} \cdot L}{V_L} = \frac{I_{peak} \cdot L}{V_{OUT}} \qquad \text{EQ. 3}$$

Where $I_{peak}$ is the maximum peak current when the PMOS was turned off and $V_L$ is voltage across the coil which is in the $t_f$ period and equal to output voltage VOUT. Using the same approach for getting $I_{peak}$, since we know the $t_r$ time and the voltage across the inductor. The voltage applied to the inductor during $t_r$ period is the difference between the input and output voltage.

$$I_{peak} = \frac{1}{L}(V_{IN} - V_{OUT}) \cdot t_r \qquad \text{EQ. 4}$$

If EQ. 3 and EQ 4 are combined, EQ. 5 is obtained, where the $t_f$ depends only on known DC voltages and $t_r$, which means $t_f$ does not depend on actual inductor value.

$$t_f = \frac{I_{peak} \cdot (Vin - Vout) \cdot t_r}{V_{OUT}} \qquad \text{EQ. 5}$$

BRIEF DESCRIPTION OF THE DRAWINGS

This invention will be described with reference to the accompanying drawings, wherein.

DETAILED DESCRIPTION

An easy way to model an integrator is by using simple capacitor charged from given current source. The relation between voltage and current in the capacitor is shown in EQ. 6:

$$v_C(t) = \frac{1}{C} \int i_C(t) dt \qquad \text{EQ. 6}$$

Figure 1:
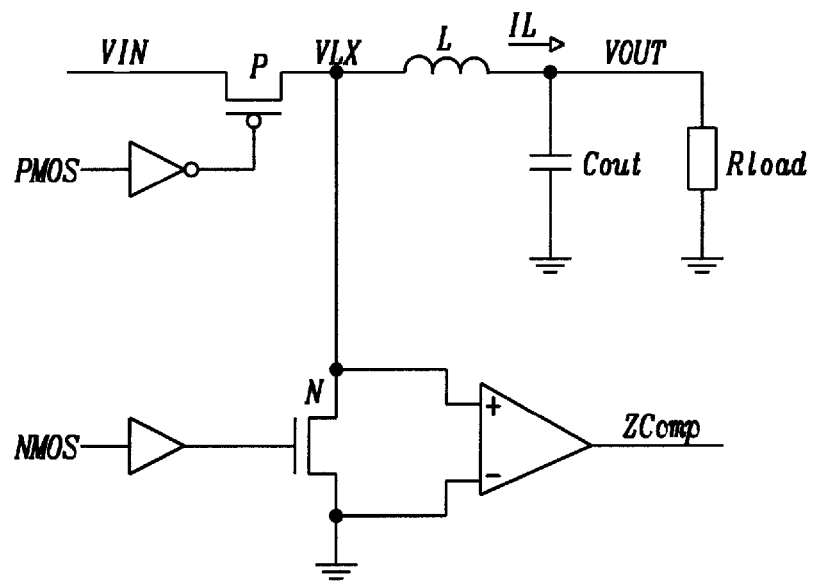
FIG. 1 is a buck type SMPS power stage of prior art with a zero crossing comparator.
Figure 2:
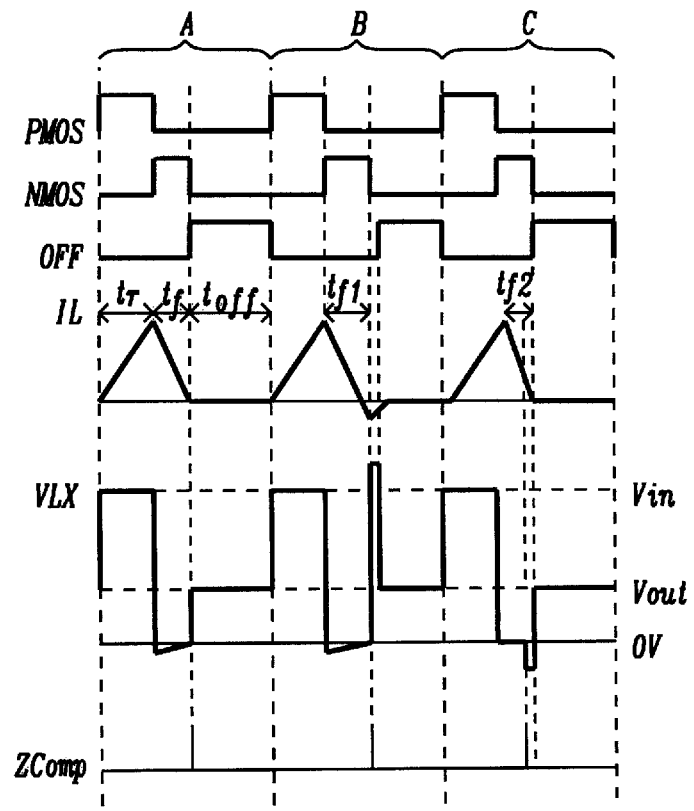
FIG. 2 is a diagram of prior art of circuit waveforms of the buck type SMPS power stage.
Figure 3:
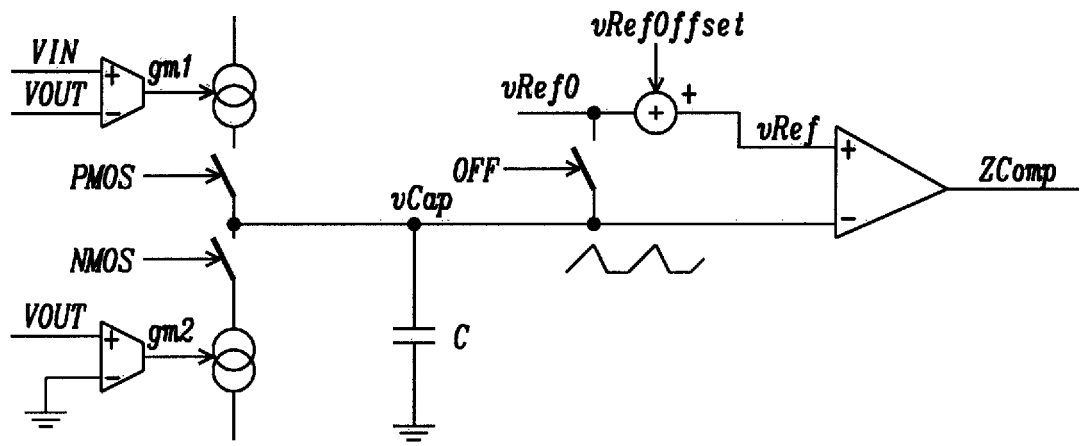
FIG. 3 is a diagram of a zero crossing time estimator of the first embodiment of the present disclosure.

EQ. 6 can be used for modeling a current in the coil as a voltage signal inside an integrated circuit chip. The core of the estimator is shown in FIG. 3. The peak current $I_{peak}$ is given by the voltage dependent current source gm1, which charges the capacitor C during the integrated circuit transistor PMOS 'on' period. The fall time $t_f$ is estimated by the discharging of capacitor C with the voltage controlled current source gm2 when integrated circuit transistor NMOS is turned 'on'. Current sources gm1 and gm2 must be the same value for correct operation. The voltage controlled current source gm1 has as an input Vin and Vout, where the voltage controlled current source gm2 controls the NMOS transistor and has as in input Vout and ground.

The procedure described herein creates coil-current-like shape voltage on the network node, vCap. The node voltage is compared with reference voltage vRef during the $t_f$ time period, and if the output, ZComp, of the comparator triggers the NMOS transistor is turned off. The capacitor C is connected to vRef0 when both switches are off in order to start from defined level. The reference Vref applied to the positive terminal of the comparator is the combination of vRef0 and vRefOffset to compensate for variations in circuit components.

Figure 4:
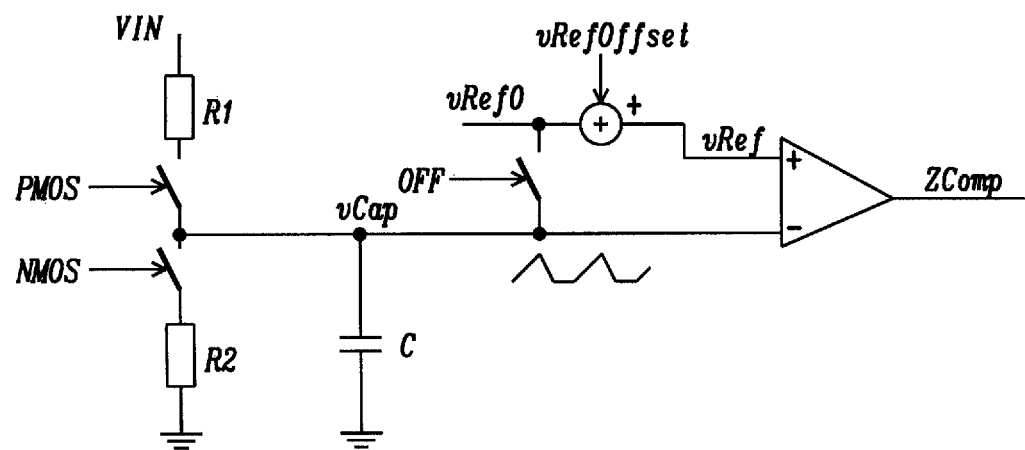
FIG. 4 is a diagram of a first variation of the zero crossing time estimator of the first embodiment of the present disclosure.

FIG. 4 demonstrates a variation on FIG. 3, wherein the voltage controlled current sources are replaced by resistors R1 and R2 with Vin being applied to one end of resistor R1. The circuit of FIG. 4 behaves similarly to the circuit of FIG. 3. The settings for correct operation for this circuit are R1=R2 and vRef0=Vout. The resistors must be of large value and well matched. The signal swing on the vCap node should be kept fairly small to neglect finite variation in current through the resistors.

Figure 5:
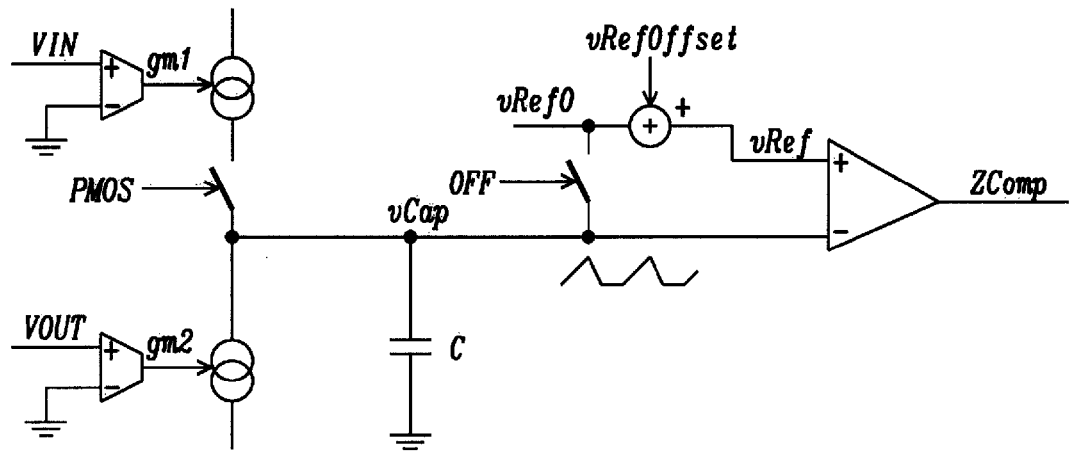
FIG. 5 is a diagram of a second variation of the zero crossing time estimator of the first embodiment of the present disclosure.

In FIG. 5 demonstrates another variation on the circuit in FIG. 3 where A voltage controlled current source gm1 has Vin and ground as input and a second voltages controlled voltage source gm2 is controlled by Vout and circuit ground. The NMOS transistor in FIG. 3 has been eliminated. The reference voltage source vRef0 must have a low output impedance since vRef0 is loaded by the current VOut*gm2 during the toff period.

Figure 6:
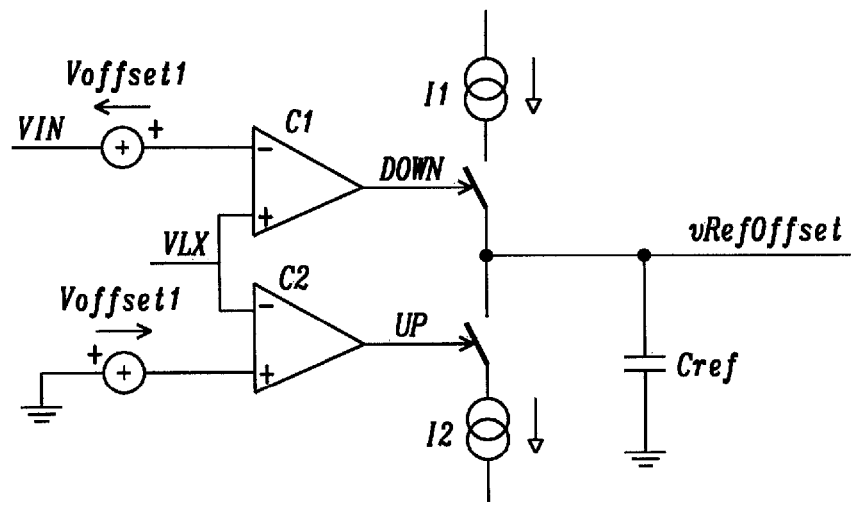
FIG. 6 is a diagram of a zero crossing comparator auto-correction circuit of the present disclosure.

The aforementioned zero-crossing comparators works fine stand alone, but there is no feedback which measure whether the timing is correct. In order to determine the timing is correct, a new feed-back is introduced. This feedback simply changes the reference voltage vRef0 by vRefOffset which corrects the timing of the zero-crossing comparator. A simplified schematic of the correction circuit is shown in FIG. 6.

It was previously mentioned that if the NMOS is not turned off at right time the voltage on VLX node (see FIG. 7) goes either below 0V or above VIN. The adaptive controller senses the low or high peaks and adjusts the vRefOffset voltage accordingly. The simplified schematic is shown in FIG. 6, and consists of two comparators C1 and C2, which compare VLX with VIN and VLX with 0V respectively. The offset voltage Voffset1 avoids misbehavior and wrong triggering of the circuit and can be different for each comparator. Output of the two comparators C1 and C2 control switches which allow charging and discharging of capacitor Cref with current I1 or I2. These currents I1 and I2 do not need to be the same value but it is recommended to keep them same. If the NMOS is turned off too late, the VLX node goes above the VIN and comparator C1 turns on the DOWN switch which increases the vRefOffset voltage and thus decreases the $t_f$.

Figure 7:
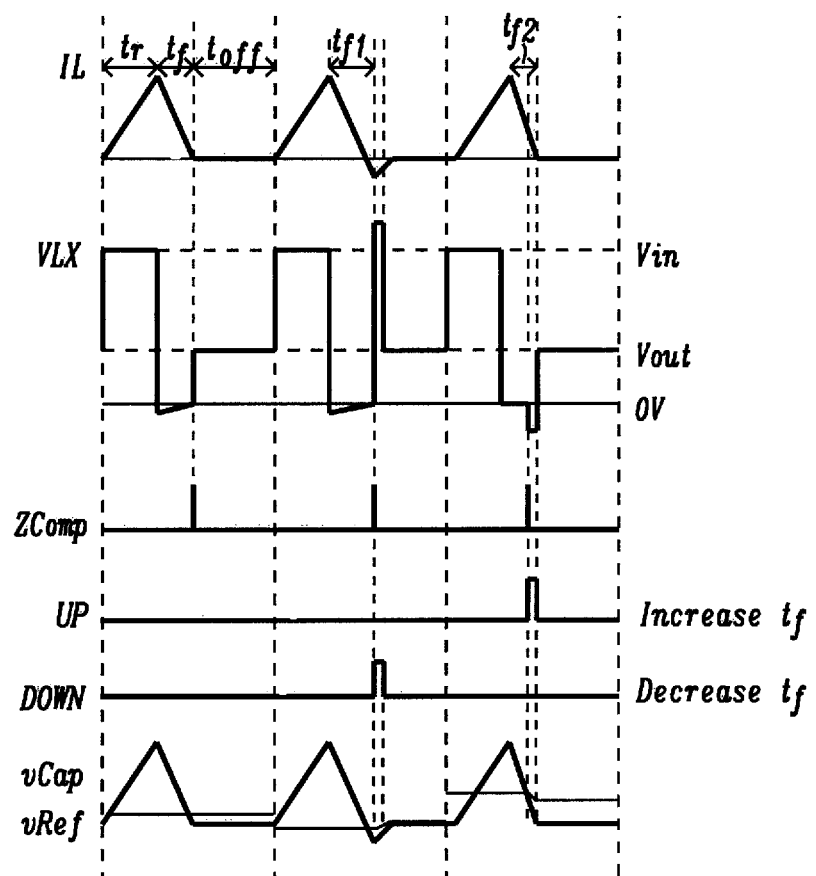
FIG. 7 is a diagram of the circuit waveforms of the auto-correction circuit of the present disclosure.

Related vCap and vRef waveforms are shown in FIG. 7. If the NMOS is turned off too early VLX node goes below zero and comparator C2 turns on the UP switch, which increases the $t_f$ time. If the vRef is set correctly there is no UP or DOWN signal since the VLX goes neither below 0 nor above VIN. This procedure trims-out offset and delay of the comparator as well.

Figure 8:
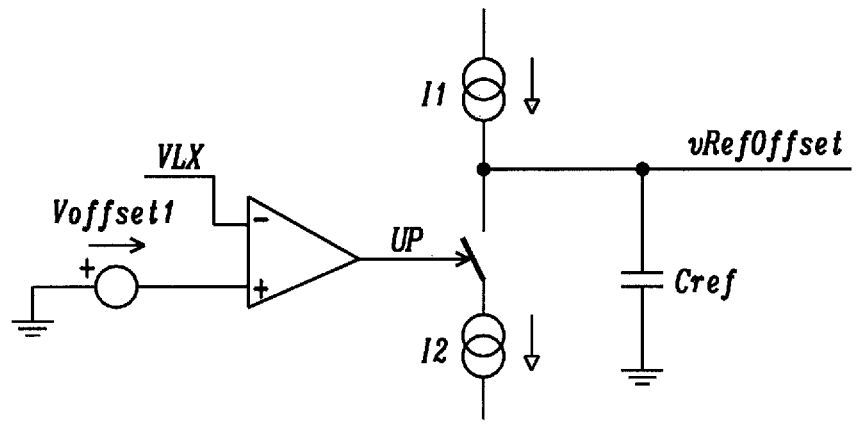
FIG. 8 is a first variation of the zero crossing comparator auto-correction circuit of the present disclosure.

A modified solution for the auto correction circuit is shown in FIG. 8. This circuit turns on the relay on negative LX pulse only. The crucial thing in this circuit is that the I1 current be significantly lower than I2. A possible solution of the I1 current source is a switched capacitor, which is synchronously charged and then it is connected to the vRefOffset. This assures precise amount of charge is transferred in to the Cref capacitor in each clock-cycle. A similar variation is to omit comparator C2 in FIG. 6 and rely on the positive peak on LX node. However, this solution has potentially slower response than the first one.

Figure 9:
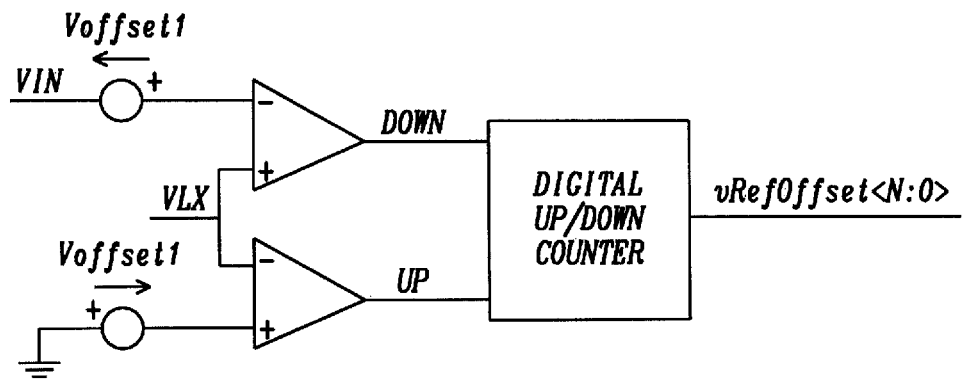
FIG. 9 is a second variation of the zero crossing comparator auto-correction circuit of the present disclosure using digital control.
Figure 10:
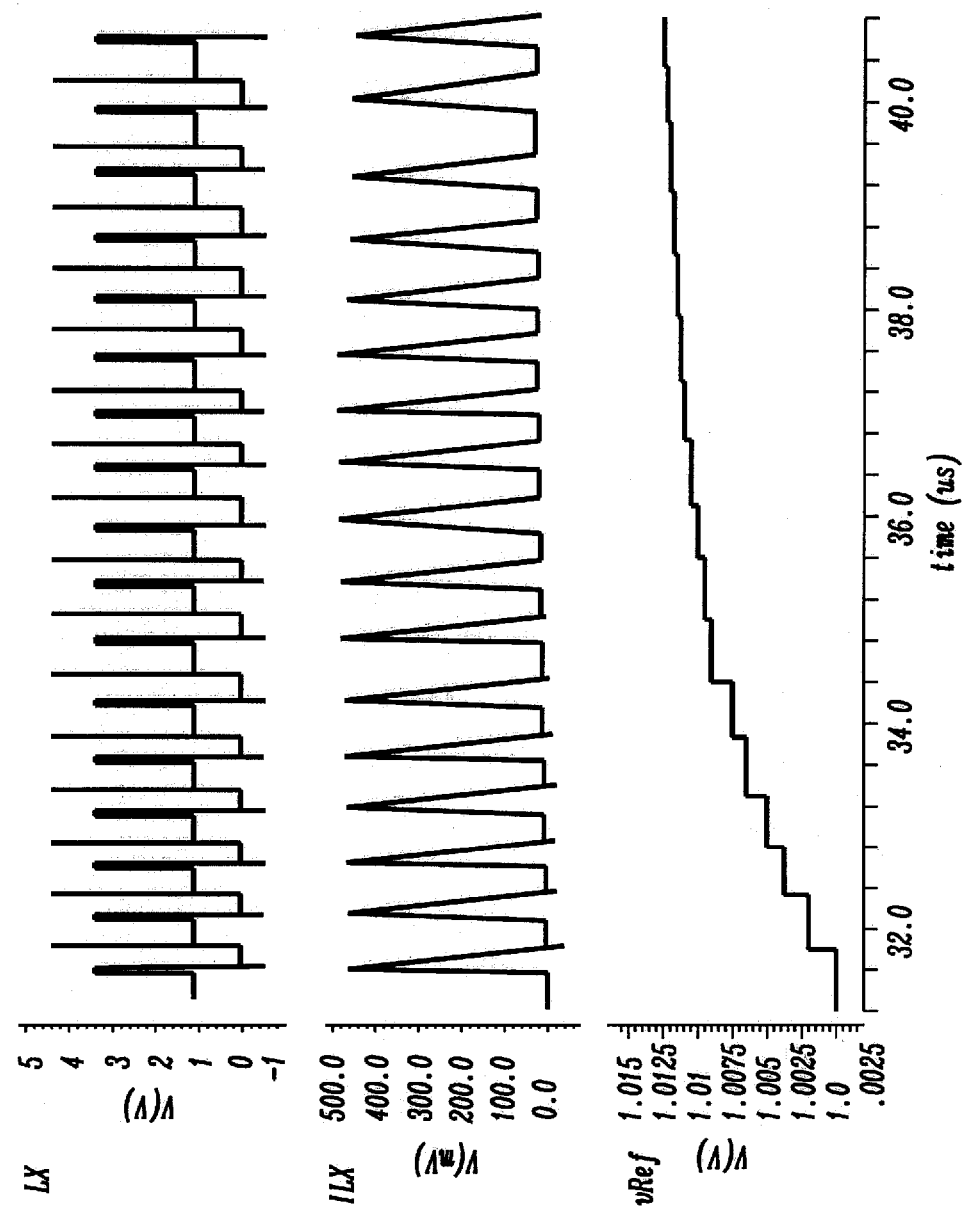
FIG. 10 is the simulation results obtained from the zero crossing comparator of the present disclosure.

Alternatively, the right part of the circuit can be replaced by digital as it is shown in FIG. 9. The outputs of the two comparators are fed into the digital up/down counter, and the output of the digital up/down counter can be used for direct control of some of the variables in the estimator, gm1, gm2, vRefOffset, and offset of the comparator. This solution might be larger than the pure analog solution but brings the possibility to easily get the digital control signal via digital test multiplexer for debugging, for example In FIG. 10 are shown simulation results. The $t_f$ time is initially longer than it should be so the current goes negative, which appears as small negative pulses in the ILX—coil current waveform. The circuit then compensates for the small negative pulses by adjusting the vRef and the small negative peaks disappear after few clock-cycles.

It should be noted that the techniques and circuitry shown herein are also applicable for other SMPS topology, for instance boost and buck-boost SMPS circuitry.

While the invention has been particularly shown and described with reference to preferred embodiments thereof, it will be understood by those skilled in the art that various changes in form and details may be made without departing from the spirit and scope of the invention.

What is claimed is:

1. A switching mode power supply (SMPS), comprising:
   a) a time off estimator to predict a time when a flow of energy is turned off in a clock cycle;
   b) a reactive element of the SMPS charged and then discharged;
   c) an adaptive controller configured to sense overshoot or undershoot of power signal in the reactive element and adjust a reference offset voltage; and
   d) said reference offset voltage connected to a first input of a compare circuit to establish a turn off setting to avoid power signal spikes caused by a turn off time being too long or energy being terminated too soon caused by the turn off time being too short.

2. The power supply of claim 1, wherein a PMOS transistor connects a first voltage dependent current source to a second voltage dependent current source and a second input of the compare circuit.

3. The power supply of claim 1, wherein the adaptive controller comprises a digitally controlled zero crossing comparator automatic correction circuit.

4. The power supply of claim 3, wherein said digitally controlled zero crossing comparator comprises a down comparator, which compares an input voltage plus an offset voltage to a power supply node voltage, and an up comparator, which compares said node voltage said offset voltage, to control the up and down digital counter to control an offset voltage to a reference capacitor.

5. A method for controlling a power supply, comprising:
   a) forming an adaptive controller to detect overshoot or undershoot of a power signal in a reactive element of a switching mode power supply;
   b) adjusting a reference offset voltage;
   c) forming a time off estimator that predicts when energy flow to said power supply is turned off in a clock cycle; and
   d) predicting a time when energy flow in said switching mode power supply is turned off to said reactive element for each cycle of charging and discharging of said reactive element.

6. The method of claim 5, wherein said time off prediction comprises a first voltage dependent current source that is controlled by an input voltage and a second voltage dependent current source that is controlled by an output voltage.

7. The method of claim 5, wherein the adaptive controller comprises a digitally controlled zero crossing comparator automatic correction circuit.

8. The method of claim 7, wherein said digitally controlled zero crossing comparator comprises an up and down comparator to drive a digital up and down counter to control variables of in said estimator.

* * * * *